United States Patent [19]

Ohsawa

[11] 4,140,960

[45] Feb. 20, 1979

[54] CURRENT CONTROL CIRCUIT

[75] Inventor: Mitsuo Ohsawa, Fujisawa, Japan

[73] Assignee: Sony Corporation, Tokyo, Japan

[21] Appl. No.: 844,282

[22] Filed: Oct. 21, 1977

[30] Foreign Application Priority Data

Oct. 28, 1976 [JP] Japan .................................. 51-129689

[51] Int. Cl.² .......................... H04B 1/10; G05F 3/08
[52] U.S. Cl. ........................................ 323/4; 325/478;
330/288
[58] Field of Search .............. 323/1, 4; 325/348, 402,
325/403, 456, 478; 330/288; 307/296, 297

[56] References Cited

U.S. PATENT DOCUMENTS

| | | | |
|---|---|---|---|
| 3,922,614 | 11/1975 | Plassche | 330/288 X |
| 4,019,121 | 4/1977 | Feindt | 323/4 |
| 4,045,746 | 8/1977 | Wheatley | 330/288 |

Primary Examiner—A. D. Pellinen
Attorney, Agent, or Firm—Lewis H. Eslinger; Alvin Sinderbrand

[57] ABSTRACT

A current control circuit for a muting circuit including a current mirror circuit formed of first and second transistor devices, one of which being operative to receive a controllable current and the other being operative to conduct a current whose value is determined by and changeable with the controllable current, such other transistor device being adapted to be connected to a load. A constant current generator generates a substantially constant current and is connected to a current-responsive circuit which, in turn, supplies the controllable current to the first-mentioned transistor device included in the current mirror circuit. A variable conducting circuit is coupled to the constant current generator for conducting a selectively variable amount of the constant current such that the level of the controllable current which is supplied to the first-mentioned transistor device is established in accordance with the difference between the constant current and the current conducted by the variable conducting circuit. Thus, the current through the current mirror circuit, and thus the load current, is determined by the conductivity of the variable conducting circuit.

11 Claims, 5 Drawing Figures

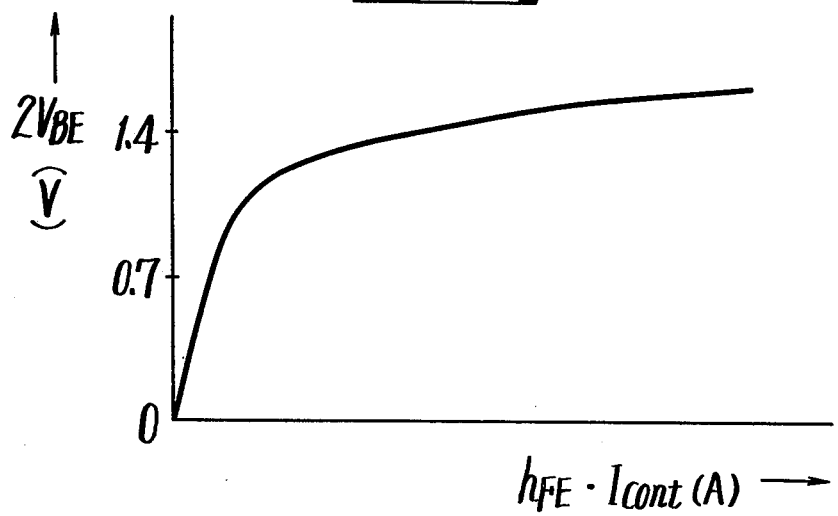
Fig. 2
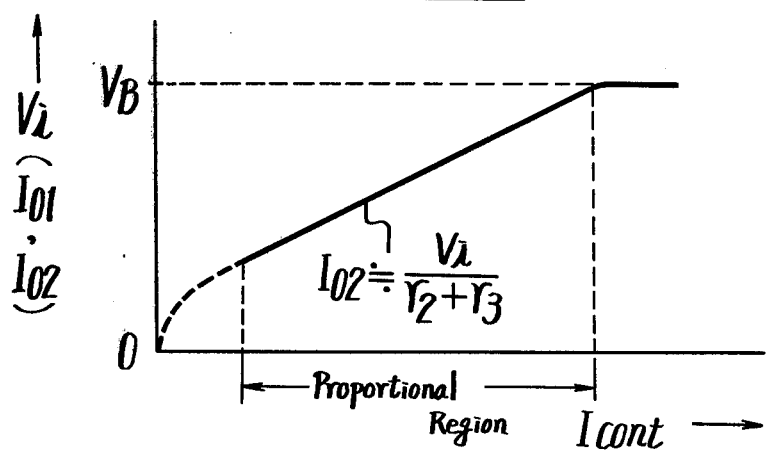
Fig. 3
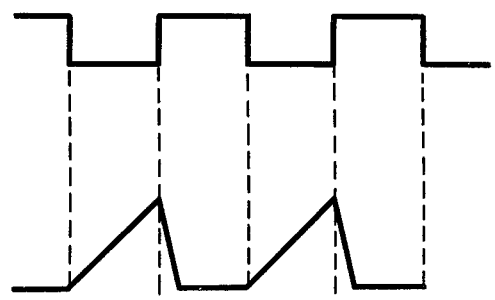
Fig. 4A
Fig. 4B

CURRENT CONTROL CIRCUIT

BACKGROUND OF THE INVENTION

This invention relates to a current control circuit and, more particularly, to such a circuit wherein a current mirror circuit is selectively controlled so as to establish a corresponding output current. This invention is particularly related to such a current control circuit for use as a selective muting circuit.

In general, a current control circuit is a particular type of circuit wherein an output current which may be supplied to various circuitry, such as an amplifier, a tuner, a modulator, a demodulator, and the like is selectively controlled in accordance with various desired functions or operating conditions. For some applications, it is preferred that some form of isolation exist so that the circuit which generates the output current does not unnecessarily load the controlling circuit, which loading could influence and deleteriously affect the output current value. From this viewpoint, it is a general object of this invention to provide a current control circuit which supplies a load current to a particular load, but the load does not influence the operation or responsiveness of the controlling circuit which is used to control the current generating portion of the current control circuit.

One advantageous application of such a current control circuit is in a muting circuit. To best appreciate the advantages achieved by this current control circuit, an example of a previously proposed muting circuit will be discussed. In my earlier U.S. Pat. No. 4,049,918, a multiplexed stereo demodulator is disclosed for deriving left (L) and right (R) audio information from a received, multiplexed stereo signal. The demodulator includes a differential amplifier having the usual constant current source for amplifying the received monophonic (L+R) signal. The received signal, which also includes the stereo component (L−R) modulated onto a carrier, is amplified by another differential amplifier, this other amplifier also including the usual constant current source. This second differential amplifier is connected to a multiplier, the latter being supplied with an unmodulated carrier, and this multiplier is further supplied with the amplified output derived from the first differential amplifier. The resultant output of the multiplier is the individual L and R channels of audio information. In the event that a muting operation is to be performed, for example, if the multiplexed demodulator is used in an FM broadcast receiver wherein interstation noise is to be muted while the tuning section is tuned from one broadcast station to another, a muting signal is produced and supplied to the aforementioned constant current sources of the individual differential amplifiers. This muting signal effectively deactivates the constant current sources such that no current flows through the differential amplifiers. As is appreciated, this effectively mutes the output of the multiplexed demodulator. When a muting operation no longer is desired, such as when the tuning section of the FM receiver is tuned correctly to a broadcast channel, the constant current sources promptly are reactivated and current once again flows through the differential amplifiers. However, this abrupt initiation of current flow may result in a loud, sudden noise in the loudspeaker system which is supplied from the demodulator. This so-called pop noise is, at best, unpleasant to a listener and may result in damage to the loudspeaker system.

The foregoing problem can be overcome by a "soft" muting control. That is, if constant current flow is reinitiated in a relatively gradual manner, a pop noise would not be produced. It is one purpose of the present invention to provide a current control circuit which can be used to control a muting operation so that "soft" muting can be achieved without the danger of a pop noise.

OBJECTS OF THE INVENTION

Therefore, it is an object of this invention to provide a novel current control circuit.

Another object of this invention is to provide a current control circuit which can be used to control a soft muting operation.

A further object of this invention is to provide a current control circuit which is adapted to control the current flowing through a load without being influenced by characteristics, such as loading characteristics, of that load.

An additional object of this invention is to provide an improved current control circuit which uses a current mirror circuit to supply an output current, the current flowing through the current mirror circuit being determined by current control circuitry.

Various other objects, advantages and features of this invention will become readily apparent from the ensuing detailed description, and the novel features will be particularly pointed out in the appended claims.

SUMMARY OF THE INVENTION

In accordance with the present invention, a current control circuit is provided with a current mirror circuit. This current mirror circuit is formed of first and second transistor devices, one of which being operative to receive a controllable current and the other being adapted to be connected to a load so as to establish a load current whose value is determined by and changeable with the current received by the first-mentioned transistor device. A constant current generator generates a substantially constant current, and a current responsive circuit is coupled to the constant current generator and is responsive thereto to supply the controllable current to the current mirror circuit. A variable conducting circuit also is coupled to the constant current generator to conduct a selectively variable amount of the generated constant current such that the level of the controllable current which is supplied to the current mirror circuit is established in accordance with the difference between the constant current and the current conducted by the variable conducting circuit. In one embodiment, a charging circuit is provided such that if the current supplied to the current responsive circuit increases, this increase is gradual and substantially linear. This produces a correspondingly linear increase in the load current supplied by the current mirror circuit.

BRIEF DESCRIPTION OF THE DRAWINGS

The following detailed description, given by way of example, will best be understood in conjunction with the accompanying drawings in which:

FIG. 2 is a graphical representation of the relationship between various parameters and is useful in understanding the operation of the present invention;

FIG. 3 is a graphical depiction of the relation between other operating parameters in the circuit of FIG.

Figure 1:
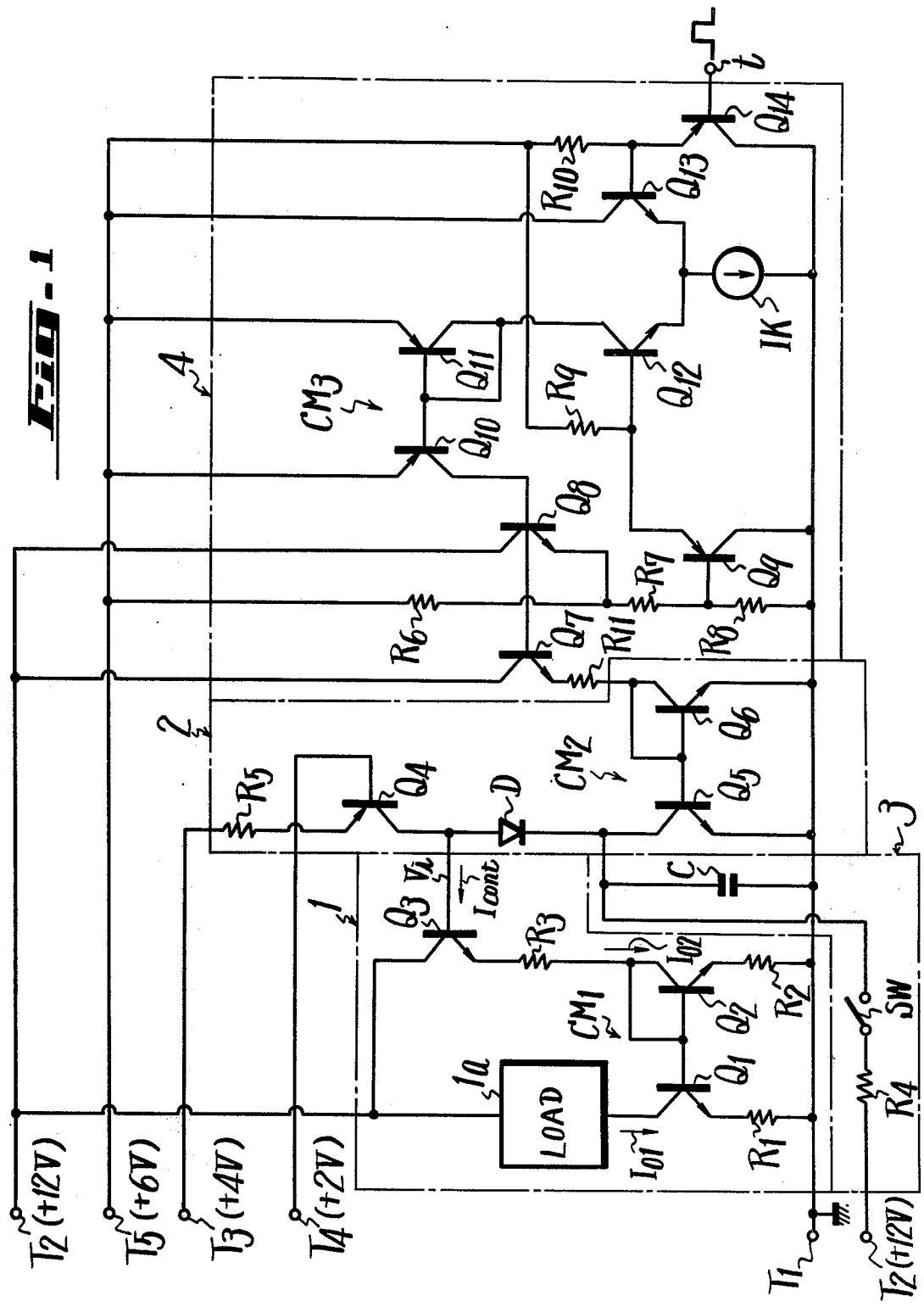
FIG. 1 is a schematic diagram of a preferred embodiment of the present invention.

1 and is useful in understanding the operation of this invention; and

FIGS. 4A and 4B are waveform diagrams showing the relation between a control signal and the output current produced by the circuit shown in FIG. 1.

DETAILED DESCRIPTION OF A CERTAIN PREFERRED EMBODIMENT

The current control circuit described below admits of general application and can be used for controlling the current flowing through a device, such as a load, in response to certain control input signals. In order to best appreciate some of the advantageous features of this current control circuit, it will be described in conjunction with one particular application thereof, viz., to control a muting operation. In particular, this muting operation may be performed in, for example, an FM radio receiver so as to mute noise which may be produced when the tuning section of the receiver is between broadcast channels. This untuned condition typically is detected at the output of the intermediate frequency (IF) section of the FM receiver. When this IF output is less than a threshold level, a proper tuning condition is not established and a muting operation should be performed. Suitable circuits are known for detecting this untuned condition and for generating a muting control signal. Conversely, when a proper tuning condition exists, the muting control signal terminates and the muting operation no longer is performed. If this muting operation is to be carried out in the environment of apparatus described in the aforementioned U.S. Pat. No. 4,049,918, a muting condition is initiated by interrupting the current flow in a differential amplifier, and the muting condition is terminated by resuming such current flow. In this regard, the following description of the current control circuit in accordance with the present invention demonstrates how this current flow is controlled, thereby controlling the muting operation.

Turning now to FIG. 1, a current control circuit 1 is shown as being connected to a load 1a for selectively controlling the current flowing through that load. Load 1a may be an amplifier, such as the IF amplifier or the audio amplifier of an FM receiver, or this load may be a tuning circuit of the FM receiver. It will be assumed that when current control circuit 1 establishes a current through load 1a, an operating mode (such as amplification) is maintained; whereas when current control circuit 1 interrupts the current flowing through load 1a, a muting operation is performed. This means that load circuit 1a will not amplify or otherwise reproduce the signal which then is supplied thereto.

FIG. 1 also shows that current control circuit 1 is connected to and controlled by a current regulating circuit 2, this current regulating circuit being coupled to a further control circuit 4. In addition, a muting defeat and control circuit 3 is coupled to current regulating circuit 2. Each of these enumerated circuits now will be described.

Current control circuit 1 includes a current mirror circuit $CM_1$ formed of transistors $Q_1$ and $Q_2$ having their base electrodes connected to each other and their respective emitter electrodes connected to a source of reference potential $T_1$ via resistors $R_1$ and $R_2$. In the illustrated embodiment, ground potential may be applied to source of reference potential $T_1$. Transistor $Q_2$ additionally has its base electrode connected directly to its collector electrode. If transistors $Q_1$ and $Q_2$ are of substantially identical characteristics and are of the same conductivity type (as an example, these transistors are shown as NPN transistors), then a current will flow through the collector-circuit of transistor $Q_1$ which is substantially equal to the current which flows through the collector-emitter circuit of transistor $Q_2$. Furthermore, the current flowing through transistor $Q_1$ will vary as the current flowing through transistor $Q_2$ varies. However, if a load, such as load 1a, is connected to transistor $Q_1$, the particular operating characteristics and parameters of this load generally will not influence the current flowing through transistor $Q_2$. Accordingly, as shown, load 1a is connected to the collector electrode of transistor $Q_1$, and a source of energizing voltage $T_2$ (+12V) is coupled to load 1a.

A transistor $Q_3$ has its collector-emitter circuit connected via a resistor $R_3$ to the collector electrode of transistor $Q_2$. Transistor $Q_3$ is a current responsive device and is adapted to establish the current flowing through transistor $Q_2$ in accordance with a controllable current which is applied to the base electrode of transistor $Q_3$. Thus, the current responsiveness of transistor $Q_3$ determines the currents in current mirror circuit $CM_1$, and thus establishes the current flowing through load 1a. As shown, the collector electrode of transistor $Q_3$ is coupled to energizing voltage source $T_2$.

Current regulating circuit 2 is comprised of a constant current transistor $Q_4$ and another current mirror circuit $CM_2$. Constant current transistor $Q_4$ is shown as a PNP transistor whose emitter electrode is coupled via a resistor $R_5$ to a source $T_3$ of energizing voltage (+4V). The base electrode of transistor $Q_4$ is connected directly to a bias voltage, shown as source $T_4$ (+2V). Since transistor $Q_4$ is shown as a PNP transistor, it is appreciated that the voltage applied to its base electrode should be less than the voltage applied to its emitter electrode so as to suitably bias the base-emitter junction thereof. Accordingly, a substantially constant current flows through the emitter-collector circuit of transistor $Q_4$.

The collector electrode of transistor $Q_4$ is connected to the base electrode of transistor $Q_3$ and also through a diode D to current mirror circuit $CM_2$. If the potential (+4V) applied to source $T_3$ is less than the potential (+12V) applied to source $T_2$, then the maximum bias voltage applied by transistor $Q_4$ to transistor $Q_3$ (relative to ground reference potential) will be less than the collector voltage of transistor $Q_3$. As will become apparent, the base voltage of transistor $Q_3$ thus may vary from approximately zero volts up to the maximum voltage which can be provided at the collector electrode of transistor $Q_4$. Current mirror circuit $CM_2$ is formed of transistors $Q_5$ and $Q_6$ whose base electrodes are connected to each other and whose emitter electrodes are connected to source $T_1$. In addition, the base and collector electrodes of transistor $Q_6$ are connected in common. The output of constant current transistor $Q_4$ is connected to the collector electrode of transistor $Q_5$. The collector electrode of transistor $Q_6$ is connected to an output transistor $Q_7$ of control circuit 4, to be described. It may be appreciated that the current flowing through transistor $Q_5$ is determined by the current supplied to transistor $Q_6$. Since the current applied to transistor $Q_5$ is generated by constant current transistor $Q_4$, it is necessary for this constant current to divide between transistors $Q_3$ and $Q_5$ depending upon the current level through current mirror circuit $CM_2$, as determined by transistor $Q_6$. That is, if the conductivity of current mirror circuit $CM_2$, as determined by transistor $Q_7$, is less than that required to conduct all of the constant current, then a portion of this constant current is applied to transistor $Q_3$. Conversely, if the conductivity of current mirror circuit $CM_2$ is high enough such that all of the constant current can flow therethrough, then substantially none of the constant current produced by transistor $Q_4$ is applied to transistor $Q_3$.

Muting defeat and control circuit 3 includes a capacitor C connected in parallel with the collector-emitter circuit of transistor $Q_5$, and the junction defined by capacitor C and the collector electrode of this transistor is connected through a switch SW and a resistor $R_4$ to energizing voltage source $T_2$. The capacitance of capacitor C is relatively large and its charging condition is selectively determined by the conductivity of current mirror circuit $CM_2$ and also by the selective operation of switch SW. That is, if current mirror circuit $CM_2$ is conductive such that the collector-emitter impedance of transistor $Q_5$ is relatively low, current from transistor $Q_4$ which also flows to diode D will flow to ground via transistor $Q_5$. Hence, capacitor C will receive a relatively small charge. If current mirror circuit $CM_2$ is not conductive, the current flowing from transistor $Q_4$ and through diode D will not pass through transistor $Q_5$. Rather, this current now will charge capacitor C. If switch SW is closed, capacitor C is charged from energizing voltage source $T_2$ through resistor $R_4$ and the closed switch SW. Since the energizing voltage (+12V) at source $T_2$ is assumed to be greater than the energizing voltage (+4V) at source $T_3$, when switch SW is closed, capacitor C will charge to a voltage (12V) which is greater than the maximum voltage which can be applied to the collector electrode of transistor $Q_4$. Hence, when diode D is poled in the indicated direction, the closing of switch SW serves to reverse bias this diode. As will be explained below, diode D is substantially forward biased at other times.

Control circuit 4 is shown as a hysteresis gate pulse generator. In addition to output transistor $Q_7$, described briefly above, whose collector-emitter circuit is connected via a resistor $R_{11}$ to transistor $Q_6$ of current mirror circuit $CM_2$ so as to supply a current derived from energizing voltage source $T_2$ to this current mirror circuit, the hysteresis gate pulse generator includes a transistor $Q_8$, a transistor $Q_9$, a current mirror circuit $CM_3$ formed of transistors $Q_{10}$ and $Q_{11}$, a differential amplifier formed of transistors $Q_{12}$ and $Q_{13}$ and a triggering transistor $Q_{14}$. Transistors $Q_{12}$ and $Q_{13}$ are of substantially identical characteristics and are connected in differential amplifier configuration wherein their emitter electrodes are connected in common via a current source IK to ground potential. The base electrode of transistor $Q_{12}$ is coupled to the emitter electrode of transistor $Q_9$, and the base electrode of transistor $Q_{13}$ is coupled to the emitter electrode of trigger transistor $Q_{14}$. The collector electrode of transistor $Q_{12}$ is coupled through transistor $Q_{11}$ of current mirror circuit $CM_3$ to a source $T_5$ of energizing voltage (+6V). The collector electrode of transistor $Q_{13}$ is connected directly to source $T_5$. The junction defined by the emitter electrode of transistor $Q_9$ and the base electrode of transistor $Q_{12}$ is coupled to source $T_5$ via a resistor $R_9$, and the similar junction defined by the emitter electrode of transistor $Q_{14}$ and the base electrode of transistor $Q_{13}$ is coupled to this source $T_5$ by a resistor $R_{10}$. Resistors $R_9$ and $R_{10}$ have equal resistance values, such as 15 kilohms. An input terminal t is coupled to the base electrode of transistor $Q_{14}$ and is adapted to receive a muting control signal, represented by the pulse shown in FIG. 1. This muting control signal, which may be produced in response to the output of an IF stage in an FM receiver, determines the conductivity of current mirror circuit $CM_1$ in current control circuit 1. Hence, when used to control a muting operation, the pulse applied to terminal t determines whether that operation is performed.

Transistors $Q_{10}$ and $Q_{11}$ forming current mirror circuit $CM_3$ are shown as PNP transistors and exhibit substantially identical characteristics. The base electrodes of these transistors are connected to each other and their emitter electrodes are connected respectively to source $T_5$. In addition, the base electrode of transistor $Q_{11}$ is connected to the collector electrode thereof. As may be appreciated, the current through transistor $Q_{11}$ is determined by the particular conductivity of the differential amplifier formed of transistors $Q_{12}$ and $Q_{13}$, and a substantially equal current flows through transistor $Q_{10}$. This output current of current mirror circuit $CM_3$ is applied to the base electrodes of transistors $Q_7$ and $Q_8$, these base electrodes being connected in common to the collector electrode of transistor $Q_{10}$.

A bias circuit formed of voltage divider resistors $R_6$, $R_7$ and $R_8$ is connected in series between source $T_5$ and ground potential. The junction defined by resistors $R_7$ and $R_8$ is connected to the base electrode of transistor $Q_9$, thereby establishing the level at which this transistor is rendered conductive, whereby the relative conductivity of transistors $Q_{12}$ and $Q_{13}$ is determined. The collector-emitter circuit of transistor $Q_8$ is connected between energizing voltage source $T_2$ and the junction defined by resistors $R_6$ and $R_7$. As may be appreciated, when transistor $Q_8$ is conductive, resistor $R_6$ is effectively removed from the voltage divider circuit which then exists from source $T_2$ through transistor $Q_8$ and resistors $R_7$ and $R_8$.

The operation of the circuit illustrated in FIG. 1 now will be described. Resistors $R_1$ and $R_2$ in current mirror circuit $CM_1$ of current control circuit 1 serve as current feedback resistors to improve the linearity of this current mirror circuit. In one example, these resistors have equal resistance values of approximately 300 ohms. Resistor $R_3$ in current control circuit 1 is adapted to limit the DC current flowing through the current mirror circuit, and thus the DC current flowing through load 1a, to a predetermined level. If the DC current flowing through load 1a, and thus through transistor $Q_1$, is represented as $I_{01}$, and if the DC current supplied to transistor $Q_2$ by transistor $Q_3$ is represented as $I_{02}$, then, because of current mirror operation, $I_{01}$ equals $I_{02}$, and these currents may be represented as:

$$I_{01} = I_{02} \approx \frac{V_i - (V_{BE2} + V_{BE3})}{r_2 + r_3} \\ = (1 + h_{FE})I_{cont} \\ \approx h_{FE} \cdot I_{cont} \qquad (1)$$

where $V_i$ is the base voltage at the base electrode of transistor $Q_3$, $V_{BE2}$ and $V_{BE3}$ are the base-emitter voltages of transistors $Q_2$ and $Q_3$, respectively, $r_2$ and $r_3$ are the resistance values of resistors $R_2$ and $R_3$, respectively, $h_{FE}$ is the current amplification factor of transistor $Q_3$ for the grounded emitter configuration, and $I_{cont}$ is the base current supplied to transistor $Q_3$. By rearranging terms, the base voltage $V_i$ of transistor $Q_3$ may be expressed as:

$$V_i = I_{02}(r_2 + r_3) + (V_{BE2} + V_{BE3})$$
$$= (1 + h_{FE})(r_2 + r_3)I_{cont} + (V_{BE2} + V_{BE3}) \quad (2)$$

Transistors $Q_1$, $Q_2$ and $Q_3$ may be selected such that the current amplification factor $h_{FE}$ thereof is relatively high. Accordingly, the base-emitter voltage of transistor $Q_2$ and the base-emitter voltage of transistor $Q_3$ may be expressed as a function of the collector current $I_{02}$ thereof as follows:

$$V_{BE2} \approx V_{BE3} \approx \frac{kT}{q} \cdot \ln\left(\frac{I_{02}}{I_s}\right)$$
$$= \frac{kT}{q} \cdot \ln\left\{\left(\frac{h_{FE}}{I_s}\right)I_{cont}\right\} \quad (3)$$

wherein k is the Boltzmann constant, T is absolute temperature, q is the electric charge on an electron and $I_s$ is the saturation current of each of transistors $Q_2$ and $Q_3$. As a practical example, the saturation current $I_s$ may be about $0.2 \times 10^{-15}$ at 3000K.

If equation (3) is substituted into equation (2), and maintaining the assumption that the current amplification factor $h_{FE}$ is relatively large ($h_{FE} \gg 1$), then the base voltage $V_i$ of transistor $Q_3$ will be as:

$$V_i = h_{FE}(r_2 + r_3)I_{cont} + \left(\frac{2kT}{q}\right)\ln\left\{\left(\frac{h_{FE}}{I_s}\right)I_{cont}\right\} \quad (4)$$

As is appreciated, the second term in equation (2) has been replaced by its equivalent value in equation (3) wherein the base-emitter voltages of transistors $Q_2$ and $Q_3$ are equal. Thus, the second term in equation (4) is:

$$2V_{BE} \approx \frac{2kT}{q} \cdot \ln\left\{\left(\frac{h_{FE}}{I_s}\right)I_{cont}\right\} \quad (5)$$

Referring to FIG. 2, a graphical representation of equation (5) is illustrated. The numerical values provided in the ordinate of this graph are typical base-emitter voltage values for a silicon transistor. Now, if the base voltage $V_i$ of transistor $Q_3$ is much greater than twice the base-emitter voltage ($V_i \gg 2V_{BE}$), then the second term in equation (4), that is, the value $2V_{BE}$, may be disregarded and the base voltage $V_i$ may be closely approximated by:

$$V_i \approx h_{FE}(r_2 + r_3)I_{cont} \quad (6)$$

Similarly, the second term in equation (2) may be disregarded, and if $(h_{FE} + 1)$ is $\approx h_{FE}$, then the currents flowing through current mirror circuit $CM_1$ may be expressed as:

$$I_{02} = I_{01} \approx \frac{V_i}{r_2 + r_3} = h_{FE} \cdot I_{cont} \quad (7)$$

The manner in which base voltage $V_i$ varies with base current $I_{cont}$ and the manner in which currents $I_{01}$ and $I_{02}$ vary with base current $I_{cont}$ is graphically depicted in FIG. 3. As shown, current $I_{02}$, and thus output current $I_{01}$ of current mirror circuit $CM_1$, varies linearly with input current $I_{cont}$ over a defined range of the input current. The broken curve shown in the left-hand portion of FIG. 3 represents the condition that the base voltage $V_i$ is not much greater than the base-emitter voltage $V_{BE}$. The voltage $V_B$ represents the maximum base voltage which can be applied to transistor $Q_3$ in the configuration shown in FIG. 1. Hence, this maximum value is the energizing voltage (+4V) provided by source $T_3$. When input current $I_{cont}$ reaches the value such that the base voltage of transistor $Q_3$ is equal to $V_B$, the currents through current mirror circuit $CM_1$ reach their maximum level. To avoid saturation of transistor $Q_3$, the energizing voltage applied to its collector electrode should be equal to or greater than the maximum voltage which can be applied to its base electrode. If the energizing voltage (+12V) provided by source $T_2$ is represented as $V_{CC}$, the the foregoing condition is satisfied if $V_{CC} \geq V_B$). As further shown in FIG. 3, the overall range of base voltage $V_i$ of transistor $Q_3$ is between zero volts and $V_B$. Hence, $0 \leq V_i \leq V_B$.

In view of the linear relation between the currents flowing through current mirror circuit $CM_1$ and the input current $I_{cont}$, it may be appreciated that if current control circuit 1 is used to control a muting operation in the manner discussed hereinabove, then a soft muting operation will be achieved. That is, the gradual increase in current $I_{01}$, which may be the constant current in one of the amplifier stages of an FM receiver, will avoid the undesired pop noise when a muting operation is terminated.

The overall operation of the circuitry shown in FIG. 1 now will be described and, in order to best appreciate the advantages achieved by this circuitry, it will be assumed that the embodiment shown in FIG. 1 functions to control a muting operation. If it is assumed that terminal t is supplied with an amplitude detected signal derived from the IF stage, or the like, of an FM receiver, then when this amplitude detected signal is below a threshold a muting operation is performed, and when this amplitude detected signal is above a threshold, the muting operation is terminated. The manner in which control circuit 4 responds to this amplitude detected signal will be described in greater detail below. Generally, however, when the amplitude detected signal is below a threshold, transistor $Q_{14}$ is conducting so as to lower the base voltage of transistor $Q_{13}$. Hence, transistor $Q_{13}$ is non-conductive and, by differential action, transistor $Q_{12}$ is conductive.

When transistor $Q_{12}$ conducts, the current flowing therethrough is equal to the current flowing through transistor $Q_{11}$. Hence, by current mirror action, a substantially equal current flows through transistor $Q_{10}$ to the base electrode of transistor $Q_7$. Transistor $Q_7$ conducts so that current flows through transistor $Q_6$ and, by current mirror action, a substantially equal current flows through transistor $Q_5$. The current through transistor $Q_5$ is supplied by constant current transistor $Q_4$. If current mirror circuit $CM_2$ is sufficiently conductive such that substantially all of the current generated by constant current transistor $Q_4$ flows through transistor $Q_5$, then the input current $I_{cont}$ to transistor $Q_3$ may be reduced to zero. It is appreciated that the input current $I_{cont}$ is equal to the difference between the current produced by constant current transistor $Q_4$ (which may be about 100 microamperes) and the current conducted by current mirror circuit $CM_2$. This difference is approximately zero if current mirror circuit $CM_2$ conducts 100 microamperes.

If input current $I_{cont}$ is approximately zero, transistor $Q_3$ is non-conductive, and currents $I_{01}$ and $I_{02}$ of current mirror circuit $CM_1$ are zero. Accordingly, current does not flow through load $1a$. This means that if current control circuit 1 is used to control a muting operation, the absence of current $I_{01}$ corresponds to such a muting operation, and this is performed when the signal applied to terminal t of control circuit 4 is less than a threshold.

If it is assumed that the amplitude detected signal applied to terminal t exceeds a threshold so as to render transistor $Q_{14}$ non-conductive, then transistor $Q_{13}$ conducts and, by differential action, transistor $Q_{12}$ is non-conductive. Hence, current does not flow through current mirror circuit $CM_3$. Consequently, a base current is not supplied to transistor $Q_7$, and current does not flow through current mirror circuit $CM_2$. Therefore, substantially all of the current produced by constant current transistor $Q_{14}$ is supplied as $I_{cont}$ to transistor $Q_3$, thereby rendering this transistor conductive. Current now flows through current mirror circuit $CM_1$, and current $I_{01}$ through load $1a$ is proportional to current $I_{cont}$ in the manner represented by equation (7).

Although the foregoing brief description has assumed that current mirror circuit $CM_2$ either is conductive or non-conductive, that is, it either is turned on or is turned off, the conductivity of current mirror circuit $CM_2$ may be varied over a desired range. In that event, the current $I_{cont}$ supplied to transistor $Q_3$ also varies over a range, since this current is equal to the difference between the constant current produced by transistor $Q_4$ and the current conducted by current mirror circuit $CM_2$. As shown in FIG. 3, as current $I_{cont}$ varies, as by varying the conductivity of current mirror circuit $CM_2$, currents $I_{01}$ and $I_{02}$ in current mirror circuit $CM_1$ vary proportionately. That is, these currents vary substantially linearly with the variation in the difference current $I_{cont}$.

Capacitor C of muting defeat and control circuit 3 is useful in obtaining a soft muting operation of current control circuit 1. It is recalled that when a muting operation is performed, that is, the amplitude detected signal applied to terminal t is less than a threshold, current mirror circuit $CM_2$ is conductive and current $I_{cont}$ applied to the base electrode of transistor $Q_3$ is approximately zero. The low collector-emitter impedance of transistor $Q_5$ prevents the current supplied by constant current transistor $Q_4$ from charging capacitor C. However, when the amplitude detected signal applied to terminal t exceeds a threshold, both current mirror circuits $CM_2$ and $CM_3$ are rendered non-conductive. The currents through these current mirror circuits may be as shown in the waveform diagram of FIG. 4A. When the current through current mirror circuit $CM_2$ is reduced to zero, as shown, the effective collector-emitter impedance of transistor $Q_5$ increases. Accordingly, the current produced by constant current transistor $Q_4$ now charges capacitor C. As capacitor C charges, the level of current flowing thereto decreases and, since current $I_{cont}$ is equal to the difference between the constant current produced by transistor $Q_4$ and the current flowing to capacitor C, this current $I_{cont}$ likewise increases. The gradual increase in this current is depicted in FIG. 4B. Since output current $I_{01}$ of current mirror circuit $CM_1$ varies linearly with current $I_{cont}$, this output current also increases gradually. Hence, if a muting operation is terminated by the "turning on" on current $I_{01}$, it is appreciated that a soft muting operation is achieved and the undesired pop noise is avoided.

When the amplitude detected signal applied to terminal t subsequently is reduced so as to initiate a muting operation, current mirror circuits $CM_2$ and $CM_3$ both are rendered conductive. This is shown as the positive transition in FIG. 4A. Capacitor C then discharges through conducting transistor $Q_5$. This means that current $I_{cont}$ decreases gradually while capacitor C discharges. This decrease in current $I_{cont}$ is shown as the negative sloping portion of waveform FIG. 4B. A corresponding gradual reduction in current $I_{01}$ flowing through load $1a$ also is achieved.

In the interest of clarity, the steady state level of current $I_{cont}$ is not shown in FIG. 4B. It is appreciated that this current does not increase indefinitely toward an infinite value.

Muting defeat and control circuit 3 can be operated so as to defeat or override a muting operation even if the amplitude detected signal applied through terminal t is less than a threshold, the condition for initiating a muting operation. In particular, when switch SW is closed, capacitor C is charged to a voltage level determined by the energizing voltage (+12V) supplied by source $T_2$. It is recalled that the maximum voltage which can be applied to the base electrode of transistor $Q_3$ has been assumed to be the energizing voltage (+4V) provided by source $T_3$. Thus, even though current mirror circuit $CM_2$ may be conductive, the relatively high voltage applied to capacitor C from source $T_2$ serves to reverse bias diode D. This means that the current generated by constant current transistor $Q_4$ is supplied as current $I_{cont}$ to transistor $Q_3$. Consequently, currents $I_{01}$ and $I_{02}$ of current mirror circuit $CM_1$ attain predetermined values corresponding to current $I_{cont}$ which now is applied to transistor $Q_3$. Hence, by closing switch SW, a muting operation which otherwise would be performed is overridden.

As mentioned above, control circuit 4 exhibits hysteresis characteristics such that it is triggered ON at one threshold level and triggered OFF at another threshold level. In particular, the voltage level which must be applied to terminal t to turn control circuit 4 ON is lower than the level which will turn this control circuit OFF. The term "ON" is intended to mean that control circuit 4 exhibits a condition whereby currents flow through current mirror circuits $CM_2$ and $CM_3$. The term "OFF" is intended to mean that currents do not flow through these current mirror circuits. Initially, let it be assumed that current mirror circuits $CM_2$ and $CM_3$ are not conductive, and control circuit 4 is OFF. Hence, transistor $Q_{12}$ is non-conductive and transistor $Q_{13}$ is conducting. This means that transistor $Q_{14}$ is non-conductive, or OFF. In order for this condition to be reversed, that is, for transistor $Q_{12}$ to become conductive, or turned ON, and for transistor $Q_{13}$ to be turned OFF, it is necessary that transistor $Q_{14}$ be turned ON. Transistor $Q_{14}$ will be turned ON so as to turn OFF transistor $Q_{13}$ when the voltage applied to the base electrode of transistor $Q_{14}$ is less than the voltage which is applied to the base electrode of transistor $Q_9$. This condition obtains because transistors $Q_9$ and $Q_{14}$ are PNP transistors. When current mirror circuits $CM_2$ and $CM_3$ are non-conducting, or are OFF, the base voltage applied to transistor $Q_9$ is determined by voltage divider resistors $R_6$, $R_7$ and $R_8$, in conjunction with the energizing voltage (+6V) provided at source $T_5$. Thus, the base voltage of transistor $Q_9$ may be expressed as $$\frac{r_8}{r_6 + r_6 + r_8} \times V_{T5},$$

wherein r is the resistance value of the corresponding resistor and $V_{T5}$ is the energizing voltage provided at source $T_5$. Hence, when the voltage applied to terminal t, that is, the base voltage of transistor $Q_{14}$, is less than this base voltage of transistor $Q_9$, the conductivitis of transistors $Q_{12}$ and $Q_{13}$ are reversed, and control circuit 4 is turned ON.

When control circuit 4 is ON, current mirror circuits $CM_2$ and $CM_3$ likewise are ON. A portion of the current flowing through transistor $Q_{10}$ of current mirror circuit $CM_3$ is applied to the base electrode of transistor $Q_8$, thereby turning this transistor ON. When transistor $Q_8$ is turned ON, its collector-emitter circuit essentially short-circuits resistor $R_6$. Thus, in the above expression representing the base voltage of transistor $Q_9$, $r_6$ is $\approx 0$. In order to turn control circuit 4 OFF, the base voltage applied to transistor $Q_{14}$ must exceed the base voltage of transistor $Q_9$. Since $r_6=0$ when the control circuit is ON, the turn-off threshold voltage which must be exceeded as expressed as $$\frac{r_8}{r_7 + r_8} \times V_{T5}$$

Thus, it is appreciated that the turn-off threshold voltage $V_{ON}$ is less than the turn-on threshold voltage $V_{OFF}$. As numerical examples, $V_{ON}$ is about 0.7 volts, and $V_{OFF}$ is about 1.2 volts. Hence, control circuit 4 may be considered to be a hysteresis pulse generator.

In constructing this hysteresis pulse generator, the collector electrode $Q_8$ may be connected to energizing voltage source $T_5$. As another alternative, voltage divider resistors $R_6$, $R_7$ and $R_8$ may be connected to energizing voltage source $T_2$. The actual turn-on and turn-off threshold levels are determined by the resistance values of these voltage divider resistors as well as the energizing voltage level which is divided thereby.

While the present invention has been particularly shown and described with reference to a preferred embodiment, it should be readily apparent that various changes and modifications in form and details may be made by one of ordinary skill in the art without departing from the spirit and scope of the invention. For example, although bipolar transistors have been shown and described, it may be appreciated that some or all of these transistors can be replaced by other equivalent devices, such as field effect transistors. Accordingly, the terms "base", "emitter" and "collector" as used in the specification and claims are intended to refer to such electrodes of a bipolar transistor as well as to the corresponding electrodes, such as gate, source and drain, of a field effect transistor.

What is claimed is:

1. A current control circuit comprising current mirror means having first and second transistor devices, one of said transistor devices being operative to receive a controllable current and the other of said transistor devices being operative to conduct a current whose value is determined by and changeable with the current received by said one transistor device, said other transistor device being adapted to be connected to a load such that the current in said load is equal to the current conducted by said other transistor device, means coupled to said one transistor device for supplying said controllable current thereto; constant current generating means for generating a substantially constant current, said means for supplying said controllable current being coupled to said constant current generating means and being operative to establish the level of said controllable current in accordance with the constant current applied thereto; and variable current conducting means coupled to said constant current generating means for conducting a selectively variable amount of said constant current such that said level of said controllable current is established in accordance with the difference between said constant current and the amount of said constant current conducted by said variable current conducting means, and said controllable current varies substantially linearly with said difference.

2. The circuit of claim 1 wherein said means for supplying said controllable current comprises a transistor having an input electrode coupled to said constant current generating means and output electrodes connected in series with said one transistor device so that the current flowing through said transistor also flows through said one transistor device.

3. The circuit of claim 2 wherein each of said transistor devices in said current mirror circuit has base, emitter and collector electrodes, with the base electrode of said one transistor device being connected to the collector electrode thereof, the base electrodes of both transistor devices being connected to each other, and the emitter electrodes of the respective transistor devices being coupled to a common reference potential.

4. The circuit of claim 2 wherein said constant current generating means comprises a constant current transistor having a base electrode connected to receive a bias voltage and its collector-emitter circuit connected in series with a source of energizing voltage, one of the collector and emitter electrodes of said constant current transistor being connected in common to the input electrode of said transistor for supplying said controllable current and said variable current conducting means.

5. The circuit of claim 1 wherein said variable current conducting means is selectively conductive and includes charging means for receiving said constant current when said current conducting means is non-conductive so as to gradually increase the current applied to said means for supplying said controllable current, whereby said controllable current received by said one transistor device is correspondingly increased.

6. The circuit of claim 5 further comprising unidirectional conducting means for supplying said constant current to said charging means; and means for controlling the conduction of said undirectional conducting means.

7. The circuit of claim 6 wherein said charging means is a capacitor, said unidirectional conducting means is a diode, and said means for controlling the conduction of the diode includes a selectively operative switch coupled between a source of voltage of magnitude greater than the maximum voltage to which said capacitor can be charged by said constant current and said capacitor for rendering said diode non-conductive, whereby the current applied to said means for supplying said controllable current attains a predetermined value with the result that said controllable current is of a predetermined level.

8. The circuit of claim 5 wherein said variable current conducting means further comprises a second current mirror circuit having first and second transistor devices, one of said transistor devices being operative to receive a control current and the other of said transistor devices being operative to conduct a current determined by the current received by said one transistor device, said one transistor device having collector and base electrodes connected together and its base electrode connected to the base electrode of said other transistor device, the collector-emitter circuit of said other transistor device being connected in parallel with said charging means and in series with said constant current generating means, and the emitter electrodes of both of said transistor devices being connected to a reference potential.

9. The circuit of claim 8 further comprising pulse generating means for supplying a control current pulse to said one transistor device.

10. The circuit of claim 9 wherein said pulse generating means includes an input terminal for receiving a trigger pulse to activate said pulse generating means, and said pulse generating means has a hysteresis characteristic to be activated and deactivated in response to different trigger pulse levels, respectively.

11. A current control circuit comprising a first current mirror circuit including first and second transistors of substantially identical characteristics having their base electrodes connected to each other and their emitter electrodes respectively coupled to a source of reference potential, the base electrode of said first transistor being connected to the collector electrode thereof and the collector electrode of said second transistor being adapted to be connected to a load; a third transistor having its collector-emitter circuit connected in series with the collector-emitter circuit of said first transistor to supply a controllable current to said first transistor; a constant current generator for supplying at an output thereof a substantially constant current; means for connecting the base electrode of said third transistor to said constant current generator output; a second current mirror circuit including fourth and fifth transistors of substantially identical characteristics having their base electrodes connected to each other and their emitter electrodes respectively coupled to said source of reference potential, the base electrode of said fourth transistor being connected to the collector electrode thereof and the collector electrode of said fifth transistor being connected to said constant current generator output such that the current supplied to the base electrode of said third transistor is proportional to the difference between said constant current and the current conducted by said fifth transistor; control means coupled to said fourth transistor for controlling the currents conducted by said fourth and fifth transistors, respectively; and means for linearly increasing the current supplied to said collector electrode of said first transistor when said control means renders said fourth and fifth transistors non-conductive.

* * * * *